(12) United States Patent
Masuda et al.

(10) Patent No.: US 8,959,421 B2
(45) Date of Patent: Feb. 17, 2015

(54) DECODING DEVICE AND DECODING ORDER CONTROL METHOD

(75) Inventors: Kyoichiro Masuda, Tokyo (JP); Kengo Oketani, Tokyo (JP)

(73) Assignee: NEC Corporation, Tokyo (JP)

( * ) Notice: Subject to any disclaimer, the term of this patent is extended or adjusted under 35 U.S.C. 154(b) by 168 days.

(21) Appl. No.: 13/637,876

(22) PCT Filed: May 13, 2011

(86) PCT No.: PCT/JP2011/061022
§ 371 (c)(1),
(2), (4) Date: Sep. 27, 2012

(87) PCT Pub. No.: WO2011/145513
PCT Pub. Date: Nov. 24, 2011

(65) Prior Publication Data
US 2013/0024753 A1    Jan. 24, 2013

(30) Foreign Application Priority Data

May 21, 2010 (JP) ................................. 2010-117240

(51) Int. Cl.
*H03M 13/00* (2006.01)
*H04L 1/00* (2006.01)
*G06F 11/07* (2006.01)
*H03M 13/09* (2006.01)
(Continued)

(52) U.S. Cl.
CPC ............ *H04L 1/005* (2013.01); *G06F 11/0754* (2013.01); *H03M 13/09* (2013.01); *H03M 13/1111* (2013.01); *G05F 1/467* (2013.01)
USPC ............................ 714/817; 714/752; 714/758

(58) Field of Classification Search
None
See application file for complete search history.

(56) References Cited

U.S. PATENT DOCUMENTS

| | | | | |
|---|---|---|---|---|
| 8,234,536 | B1* | 7/2012 | Farjadrad et al. | 714/752 |
| 8,284,693 | B2* | 10/2012 | Stauffer et al. | 370/252 |
| 2004/0039769 | A1* | 2/2004 | Orio | 708/530 |

(Continued)

FOREIGN PATENT DOCUMENTS

| | | |
|---|---|---|
| CN | 1083184 C | 4/2002 |
| CN | 1926831 A | 3/2007 |

(Continued)

OTHER PUBLICATIONS

Takasawa Jun, et. al., "Self-Healing for ATM Network with Multiple Priority Classes", IEICE, 1998, Comprehensive Lecture Collections, Communication 2, 1998, p. 381, B-8-34.

(Continued)

*Primary Examiner* — Daniel McMahon
(74) *Attorney, Agent, or Firm* — Sughrue Mion, PLLC

(57) ABSTRACT

A decoding device that performs decoding of data transmitted from each of a plurality of users comprises an iterative decoding section that repeats decoding of the data until no error is detected in a result of decoding, an error detection section that performs error detection on the decoding result each time decoding is performed, and a decoding order control section that estimates with respect to each of the plurality of users a decoding completion time, which is a time period required until no error is detected in the result of decoding of the data transmitted from the user, and that assigns priorities to the users in increasing order of the estimated decoding completion time. The iterative decoding section performs decoding of the data transmitted from the users in descending order of the priorities.

2 Claims, 8 Drawing Sheets

(51) Int. Cl.
*H03M 13/11* (2006.01)
*G05F 1/46* (2006.01)

(56) References Cited

U.S. PATENT DOCUMENTS

| | | | |
|---|---|---|---|
| 2009/0077457 | A1 | 3/2009 | Ramesh et al. |
| 2009/0094499 | A1 | 4/2009 | Deoka |
| 2013/0086443 | A1* | 4/2013 | Miyazaki .................... 714/752 |

FOREIGN PATENT DOCUMENTS

| | | | |
|---|---|---|---|
| JP | 2000-36838 | A | 2/2000 |
| JP | 2002-152056 | A | 5/2002 |
| JP | 2003-198513 | A | 7/2003 |
| JP | 2004-304620 | A | 10/2004 |
| JP | 2005-260608 | A | 9/2005 |
| JP | 2007-6382 | A | 1/2007 |
| JP | 2007-36683 | A | 2/2007 |
| JP | 2009-89312 | A | 4/2009 |
| JP | 2009-159643 | A | 7/2009 |
| JP | 2009-212829 | A | 9/2009 |
| WO | 03056706 | A1 | 7/2003 |
| WO | 2007000917 | A1 | 1/2007 |
| WO | 2008/015742 | A1 | 2/2008 |
| WO | 2009/107419 | A1 | 9/2009 |

OTHER PUBLICATIONS

Communication from the Japanese Patent Office dated Dec. 24, 2013, in a counterpart Japanese application No. 2012-515856.

International Search Report for PCT/JP2011/061022 dated Aug. 16, 2011.

Communication dated Sep. 1, 2014, issued by the State Intellectual Property Office of the People's Republic of China in counterpart Application No. 201180025109.5.

\* cited by examiner

Fig.5

|  | The number of decoding iterations | |
|---|---|---|
|  | Case 1 | Case 2 |
| User#1 | 3 | 8 (NG) |
| User#2 | 4 | 4 |
| User#3 | 4 | 4 |
| User#4 | 3 | 3 |
| User#5 | 8 (NG) | 8 (NG) |
| User#6 | 3 | 3 |
| User#7 | 3 | 8 (NG) |
| User#8 | 4 | 4 |
| User#9 | 3 | 3 |
| User#10 | 5 | 5 |
| Sum of the numbers of decoding iterations | 40 | 50 |

Fig.6

| Processing order | Case 1 | Case 2 |
|---|---|---|
| 1 | User#1 | User#4 |
| 2 | User#4 | User#6 |
| 3 | User#6 | User#9 |
| 4 | User#7 | User#2 |
| 5 | User#9 | User#3 |
| 6 | User#2 | User#8 |
| 7 | User#3 | User#10 |
| 8 | User#8 | User#1 |
| 9 | User#10 | User#7 |
| 10 | User#5 | User#5 |

DECODING DEVICE AND DECODING ORDER CONTROL METHOD

CROSS REFERENCE TO RELATED APPLICATIONS

This application is a National Stage of International Application No. PCT/JP2011/061022 filed May 13, 2011, which claims priority from Japanese patent application JP 2010-117240 filed May 21, 2010, the contents of all of which are incorporated herein by reference in their entirety.

TECHNICAL FIELD

The present invention relates to a decoding device and a decoding order control method.

BACKGROUND ART

In recent years, many systems including wireless communication systems, such as Wideband-Code Division Multiple Access (W-CDMA), Long Term Evolution (LTE) and Worldwide Interoperablity for Microwave Access (WiMAX), and Advanced Digital Satellite Broadcasting System in Japan, use a turbo code and a low-density parity-check code (LDPC) as an error-correcting code. These codes are characterized by having such a high error-correcting effect so as to enable achieving a high transfer rate close to the Shannon limit.

It is a common practice to perform iterative decoding in the case of decoding of data encoded by means of a turbo code or a LDPC code. Iterative decoding is a process in which decoding is performed by using reliability information obtained by decoding at the immediately preceding time and this process is performed a certain number of times. Iterative decoding has a high error-correcting effect but has the drawback of requiring an enormous amount of processing time when the number of decoding iterations is large.

In a base station used in a wireless communication system such as the above-mentioned LTE or WiMAX system, decoding of data sent from a plurality of user terminals needs to be completed within a certain time period so as to satisfy a predetermined delay requirement. However, if the number of users is increased, and if the number of decoding iterations for each user is increased, there is a possibility of failure to complete decoding of data from all the users within the certain time period, which means the possibility of a reduction in throughput of the system.

Therefore various methods for controlling the number of decoding iterations are being studied.

Methods studied as a method for controlling the number of decoding iterations include, for example, a method in which a maximum number of decoding iterations is set in common for all users in advance and decoding is repeatedly performed until the number of decoding iterations becomes equal to the maximum number.

Also, in patent literature 1 (JP2002-152056A), a method is discussed in which with respect to each user, the state of a channel used by the user's terminal for the transmission of data is determined; a maximum number of decoding iterations for the user is set based on the state of the channel determined with respect to the user; and decoding is repeated until the number of decoding iterations becomes equal to the maximum number.

Another method in which a maximum number of decoding iterations is fixed; error detection is performed each time decoding is performed; and determination is made as to whether or not decoding is to be repeated. In this method, a user terminal on a transmitting side adds cyclic redundancy check (CRC) bits for error detection to data, thereafter encodes the data and transmits the encoded data. A decoding device in a base station on a receiving side repeats decoding and error detection on the result of decoding by means of CRC. If no error is detected in the decoding result, the decoding device discontinues decoding even before the number of decoding iterations becomes equal to the maximum number. This decoding device will be described with reference to FIG. 1.

Referring to FIG. 1, data I(0), I(1), . . . , I(N−1) is data transmitted from user terminals. This data will be referred to as "data before decoding". Data O(0), O(1), . . . , O(N−1) is data output from decoding device 10 after decoding on the data before decoding. This data will be referred to as "data after decoding". Suffixes in brackets for the data before decoding and the data after decoding represent user numbers, and N represents the number of users for whom decoding device 10 performs decoding.

The decoding device 10 shown in FIG. 1 has iterative decoding section 11 and error detection section 12.

Iterative decoding section 11 performs decoding of the data before decoding from a user and outputs a decoding result to error detection section 12.

Error detection section 12 performs error detection by CRC on the decoding result output from iterative decoding section 11 and outputs the decoding result to the outside if no error is detected. On the other hand, if an error is detected in the decoding result, error detection section 12 outputs reliability information to iterative decoding section 11. Iterative decoding section 11 is informed of the occurrence of the error in the decoding result through the output of the reliability information.

When the data after decoding is output to the outside, iterative decoding section 11 performs decoding of the data before decoding from another user. On the other hand, when the reliability information is output from error detection section 12, iterative decoding section 11 again performs decoding of the data before decoding from the same user by using the reliability information.

FIG. 2 is a flowchart showing the operation of decoding device 10 shown in FIG. 1.

In the following description, n is used as a variable number representing the number of user numbers, and n is an integer equal to or larger than 0.

In the following description, k is used as a variable number representing the number of decoding iterations, and k is an integer equal to or larger than 0. Also, in the following description, the maximum number of decoding iterations is Kmax.

Iterative decoding section 11 starts processing in order from n=0 (step S101).

Iterative decoding section 11 first determines whether or not n is smaller than N (step S102). If n is smaller than N (step S102: Yes), iterative decoding section 11 sets k=0 (step S103) and performs decoding of the data before decoding I(n). Iterative decoding section 11 also increments k by 1 (step S104).

Error detection section 12 performs error detection by CRC on the result of decoding of the data before decoding I(n) (step S105) and determines whether or not any error has been detected (step S106).

If an error is detected in the decoding result (step S106: Yes), iterative decoding section 11 determines whether or not k is smaller than Kmax (step S107). If k is smaller than Kmax (step S107: Yes), error detection section 12 outputs reliability information to iterative decoding section 11 (step S108) and iterative decoding section 11 performs decoding of the data before decoding I(n) by using the reliability information and increments k by 1 (step S104).

If no error is detected in the decoding result (step S106: No), or if k is not smaller than Kmax (if the number of decoding iterations becomes equal to the maximum number of decoding iterations), error detection section 12 outputs the decoding result output from iterative decoding section 11 as data after decoding O(n) (step S109).

When data after decoding O(n) is output, iterative decoding section 11 increments n by 1 (step S110). The processing from step S102 to step S110 is thereafter repeated until n=N−1, thereby performing decoding of the data before decoding from all users.

When decoding of the data before decoding from all the users is completed, and when n is not smaller than N (step S102: No), iterative decoding section 11 ends the process.

Thus, if no error is detected by error detection section 12, iterative decoding section 11 discontinues decoding even before the number k of iterations of decoding becomes equal to the maximum number Kmax.

Therefore the number of decoding iterations can be reduced in comparison with the method in which decoding is repeated until the number of decoding iterations becomes equal to the maximum number Kmax.

CITATION LIST

Patent Literature

Patent Literature 1: JP2002-152056A

SUMMARY OF INVENTION

Technical Problem

However, while studies were made for the above-described three methods as to how to control the number of decoding iterations, no studies were made as to the order in which data from a plurality of users is decoded.

Therefore, there is a possibility of failure to complete decoding of data from a sufficiently large number of users within a certain time period, depending on the order of the users for which decoding of data is performed, which means a possibility of a reduction in throughput.

An object of the present invention is to provide a decoding device and a decoding order control method capable of solving the above-described problem.

To achieve the above-described object, according to the present invention, a decoding device that performs decoding of data transmitted from each of a plurality of users, includes:

an iterative decoding section that repeats decoding of the data until no error is detected in a result of decoding;

an error detection section that performs error detection on the decoding result each time decoding is performed by the iterative decoding section, and that, if an error is detected, outputs to the iterative decoding section a signal indicating that the error has been detected in the decoding result; and a decoding order control section that estimates, with respect to each of the plurality of users, a decoding completion time, which is the time period required until no error is detected by the error detection section in the result of decoding of the data transmitted from the user, and that assigns priorities to the users in increasing order of the estimated decoding completion time, wherein the iterative decoding section performs decoding of the data transmitted from the users for the users in descending order of the priorities assigned by the decoding order control section.

To achieve the above-described object, according to the present invention, a decoding order control method applied to a decoding device that performs decoding of data transmitted from each of a plurality of users, includes:

repeating decoding of the data until no error is detected in a result of decoding;

performing error detection on the decoding result each time decoding is performed, and outputting, when an error is detected, a signal indicating that the error has been detected in the decoding result; and estimating, with respect to each of the plurality of users, a decoding completion time, which is the time period required until no error is detected in the result of decoding of the data transmitted from the user, and assigning priorities to the users in increasing order of the estimated decoding completion time, wherein decoding of the data transmitted from the users is performed for the users in descending order of the assigned priorities.

According to the present invention, the decoding device estimates a decoding completion time with respect to each user, and performs decoding of data from the users in increasing order of the estimated decoding completion time.

Decoding of data from a larger number of users can be completed within a certain time period by decoding the data from the users in increasing order of the decoding completion time, thus limiting a reduction in throughput.

BRIEF DESCRIPTION OF DRAWINGS

FIG. 5 is a diagram for explaining a change in the number of users for which decoding is completed within a certain time period, depending on the execution/nonexecution of decoding order control.

FIG. 6 is a diagram showing priorities with which decoding of data is performed, and which are assigned by a decoding order control section shown in FIG. 3.

DESCRIPTION OF EMBODIMENTS

Exemplary embodiments of the present invention will be described with reference to the drawings.

A decoding device in accordance with the present invention is provided, for example, in a base station in which data transmitted from a plurality of user terminals is processed.

First Exemplary Embodiment

Figure 3:
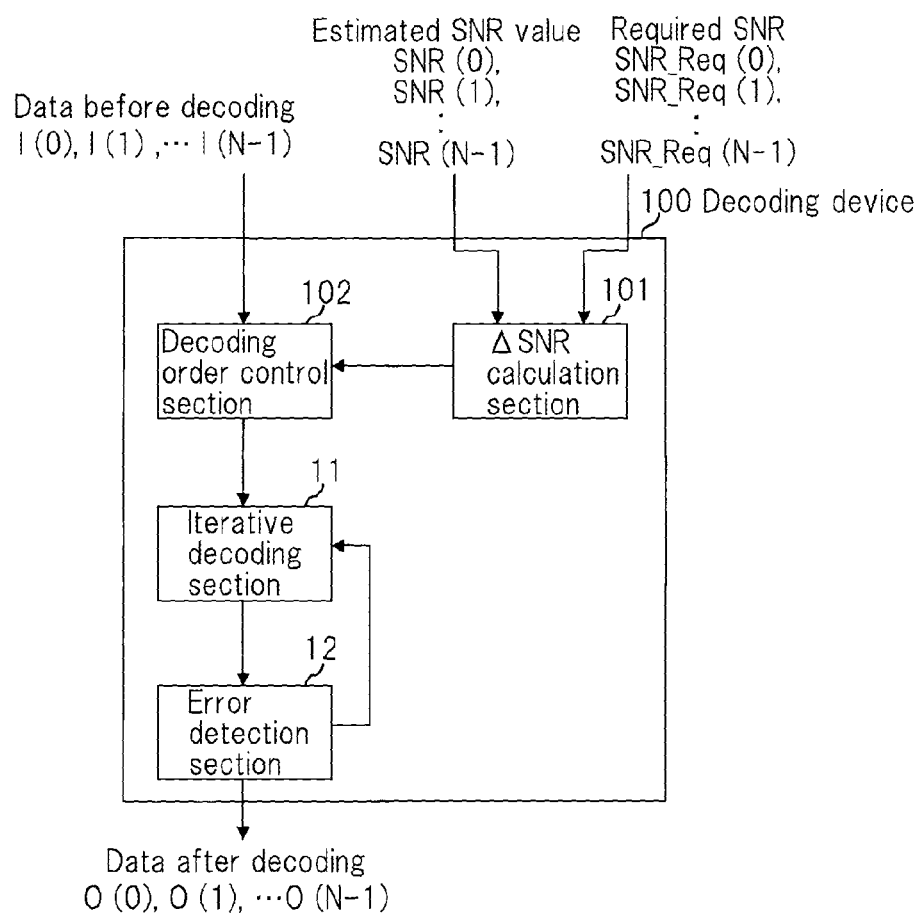
FIG. 3 is a block diagram showing the configuration of a decoding device in a first exemplary embodiment of the present invention.

FIG. 3 is a block diagram showing the configuration of decoding device 100 in a first exemplary embodiment of the present invention.

Figure 1:
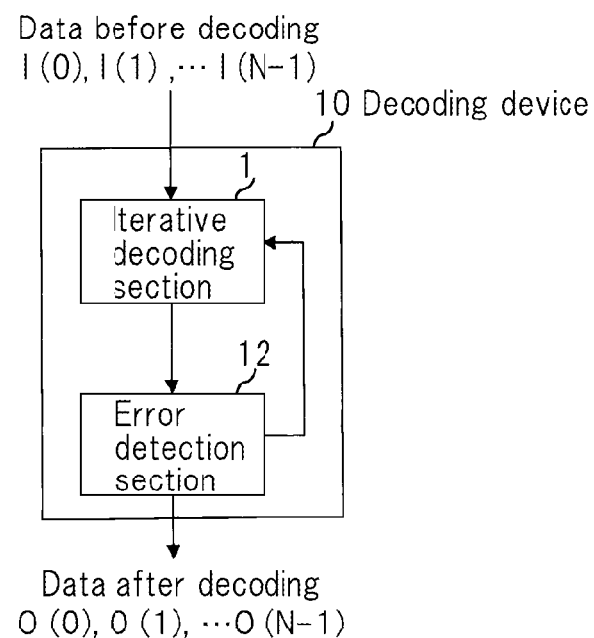
FIG. 1 is a block diagram showing the configuration of a related decoding device.

In FIG. 3, components corresponding to those shown in FIG. 1 are indicated by the same reference numerals. The description for the corresponding components will not be repeated.

Decoding device 100 shown in FIG. 3 has ΔSNR (signal to noise ratio) calculation section 101, decoding order control section 102, iterative decoding section 11 and error detection section 12.

ΔSNR calculation section 101 is an example of the calculation section.

ΔSNR calculation section 101 is provided with estimated SNR values (SNR(0), SNR(1), . . . , SNR(N−1)) and required SNRs (SNR_Req(0), SNR_Req(1), . . . , SNR_Req(N−1)) with respect to data before decoding from a plurality of user terminals. Suffixes in brackets for the estimated SNR values and the required SNRs represent user numbers.

The estimated SNR values are values estimated by another device in the base station in which the decoding device 100 is provided. The estimated SNR values are provided from another device to ΔSNR calculation section 101. Estimation of the SNR is performed by a method well known to those skilled in the art. The method, however, is not in any direct relation to the present invention and, therefore, will not be described.

The required SNR is a target SNR value necessary for making the rate of errors in data transmitted from the corresponding user terminal equal to or lower than a certain probability. The required SNR is determined by the modulation method for the data and the code rate of the data. The required SNRs are managed by a still another device in the base station in which decoding device 100 is provided. The required SNRs are provided from the still another device to ΔSNR calculation section 101.

ΔSNR calculation section 101 calculates ΔSNR with respect to each user based on the estimated SNR value and the required SNR with respect to the data before decoding from the user by using equation (1):

$$\Delta SNR(n) = SNR(n) - SNR\_Req(n) \quad (1)$$

ΔSNR calculated with respect to one of the users indicates a state of the channel used for the transmission of the data before decoding from the user.

The estimated SNR value with respect to the data before decoding is influenced by the state of the channel used for the transmission of the data before decoding, the modulation method for the data before decoding and the code rate of the data before decoding. On the other hand, the required SNR is determined by the modulation method for the data before decoding and the code rate of the data before decoding, as described above.

Therefore, the influence of the state of the channel on the estimated SNR value, i.e., the state of the channel, can be found by calculating ΔSNR. A larger value of ΔSNR indicates that the state of the channel is better.

ΔSNR calculation section 101 calculates ΔSNR with respect to each user and outputs the calculated ΔSNR to decoding order control section 102.

Decoding order control section 102 is provided with ΔSNR calculated with respect to each user and data before decoding I(0), I(1), . . . , I(N−1).

Decoding order control section 102 assigns users priorities with which the data before decoding is decoded, based on ΔSNRs output from ΔSNR calculation section 101.

Assignment of priorities with which the data before decoding is decoded is performed as described below.

Decoding order control section 102 first estimates a decoding completion time with respect to each user based on ΔSNR calculated with respect to the user.

In general, if the condition of a channel over which data is transmitted is better, the number of decoding iterations of the data until no error is detected is smaller and it is estimated that the decoding completion time is shorter. Accordingly, if ΔSNR calculated for one of the users is larger, decoding order control section 102 estimates that the decoding completion time with respect to the user is shorter.

Decoding order control section 102 assigns priorities to the users in increasing order of the estimated decoding completion time, and outputs to iterative decoding section 11 the data before decoding from the users in descending order of the assigned priorities.

In iterative decoding section 11 and error detection section 12, the same processing operations as those described above are performed to output data after decoding O(0), O(1), . . . , O(N−1).

The operation of decoding device 100 will next be described.

Figure 4:
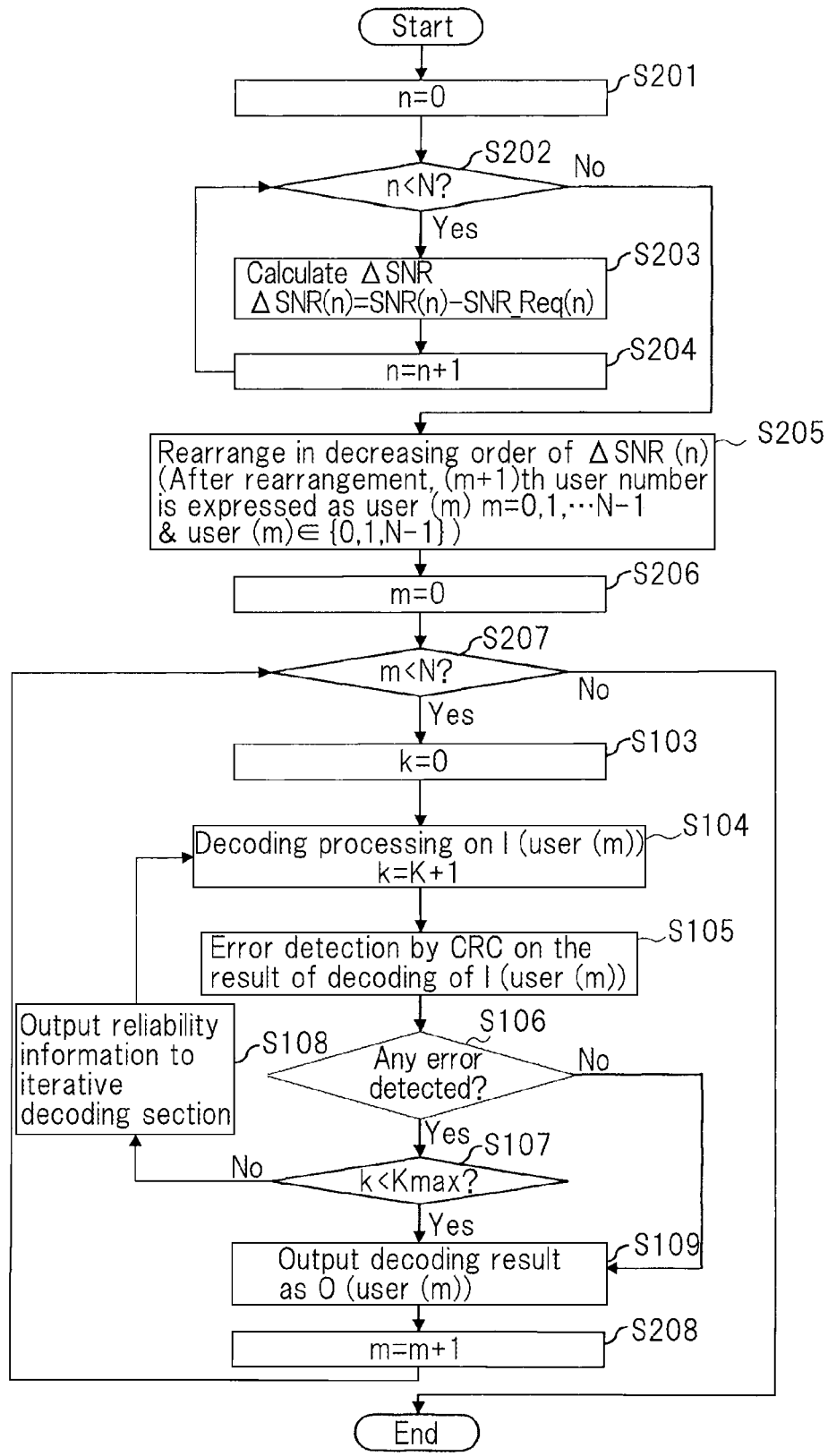
FIG. 4 is a flowchart showing the operation of the decoding device shown in FIG. 3.

FIG. 4 is a flowchart showing the operation of decoding device 100 in the present exemplary embodiment.

Figure 2:
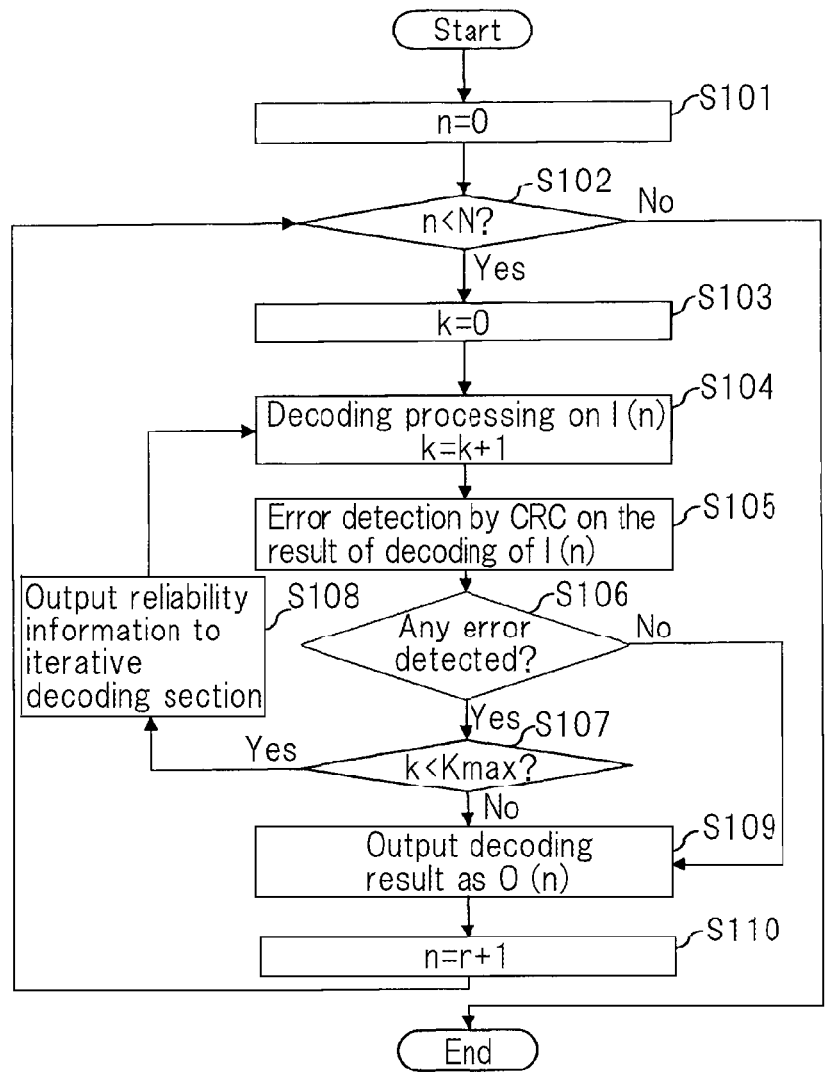
FIG. 2 is a flowchart showing the operation of the decoding device shown in FIG. 1.

In FIG. 4, the same processing operations as those shown in FIG. 2 are indicated by the same reference numerals and the description of them will not be repeated.

ΔSNR calculation section 101 starts processing in order from n=0 (step S201).

ΔSNR calculation section 101 determines whether or not n is smaller than N (step S202).

If n is smaller than N (step S202: Yes), ΔSNR calculation section 101 calculates ΔSNR(n) based on the estimated SNR value (SNR(n)) and the required SNR (SNR_Req(n)) with respect to data before decoding I(n) with user number n by using equation (1) (step S203). Further, ΔSNR calculation section 101 increments n by 1 (step S204). Subsequently, processing from step S202 to step S204 is repeated until n=N−1, thereby calculating ΔSNR with respect to all the users.

When calculation of ΔSNR with respect to all the users is completed, and when n is not smaller than N (step S202: No), ΔSNR calculation section 101 outputs calculated ΔSNR(0), ΔSNR(1), . . . , ΔSNR(N−1) to decoding order control section 102.

Decoding order control section 102 assigns priorities to the users in decreasing order of ΔSNR, i.e. in increasing order of the estimated decoding completion time. Further, decoding order control section 102 rearranges the data before decoding according to the array of the users with the assigned priorities in descending order (step S205), and outputs the data before decoding in the rearranged order to iterative decoding section 11.

In the following description, the user number for the user at the (m+1)th ΔSNR level from the highest level is expressed as user(m). The number m is an integer not smaller than 0, and user(m)∈{0, 1, . . . , N−1}. The relationship among ΔSNRs calculated with respect to the users is as shown by an expression (2):

$$\Delta SNR(user(0)) \geq \Delta SNR(user(1)) \geq \Delta SNR(user(2)) \geq \ldots \geq \Delta SNR(user(N-1)) \quad (2)$$

At this time, the data before decoding is input in the order of I(user(0)), I(user(1)), . . . , I(user(N−1)) to iterative decoding section 11.

Iterative decoding section 11 starts processing in order from m=0 (step S206).

Iterative decoding section 11 first determines whether or not m is smaller than N (step S207).

If m is smaller than N (step S207: Yes), iterative decoding section 11 sets k=0 (step S103) and performs decoding of data before decoding I(user(m)). Decoding by iterative decoding section 11 and error detection by error detection section 12 are thereafter performed (steps S104 to S108) to output data after decoding O(user(m)) (step S109). When data after decoding O(user(m)) is output, iterative decoding section 11 increments m by 1 (step S208). The processing from step S207 to step S208 is thereafter repeated until m=N−1, thereby performing decoding of the data before decoding from all the users.

When decoding of the data before decoding from all the users is completed, and when m is not smaller than N (step S207: No), iterative decoding section 11 ends the process.

A change in the number of users for which decoding is completed within a certain time period, depending on the execution/nonexecution of decoding order control by decoding order control section 102, will next be described.

With respect to the following description, it is assumed that the number of users for which decoding device 100 performs decoding processing is N=10 and the maximum number of decoding iterations is Kmax=8. It is also assumed that the processing time taken to perform decoding one time is 25 μs and the time period assigned to the decoding processing is 1000 μs.

Decoding device 100 can perform decoding processing only for the assigned time period. When the assigned time period elapses, decoding device 100 discontinues decoding processing. In this case, the results of decoding of all the data from the users for whom decoding has not been completed are NG (a state where an error is detected by error detection section 12).

The number of users for whom decoding is completed within the time period assigned for decoding processing will be considered with respect to two cases (Case 1 and Case 2) shown in FIG. 5.

FIG. 5 shows the numbers of iterations before the completion of decoding with respect to the users and the sum of the number of decoding iterations with respect to the users in each case.

User entries with which entries of "NG" in FIG. 5 are associated indicate users from whom errors are detected even after the number of decoding iterations becomes equal to the number (8) of decoding iterations.

It is also assumed that decoding order control section 102 assigns the users priorities with which decoding of data before decoding is performed, as shown in FIG. 6.

The user priority order shown in FIG. 6 coincides with the priority order of the users with whom smaller number of decoding iterations is associated.

This is because decoding order control section 102 estimates that if a smaller number of decoding iterations is associated with one of the users, or if a larger ΔSNR is calculated with respect to the user, the decoding completion time with respect to the user is shorter, and assigns a higher priority to the user.

The number of users for whom decoding is completed within the time period assigned to decoding processing in Case 1 is first considered.

In Case 1, the sum of the number of decoding iterations is 40. Accordingly, 40×25=1000 μs is required for decoding of data before decoding from all the users. This time period is no longer than the time period assigned for decoding processing (1000 μs). Therefore decoding of the data before decoding from all the users can be completed within the assigned time period regardless of the order of user priorities for which decoding processing is performed.

The number of users for whom decoding is completed within the time period assigned to decoding processing in Case 2 is next considered.

In Case 2, the sum of the number of decoding iterations is 50. Accordingly, 50×25=1250 μs is required for decoding of data before decoding from all the users. This time period is longer than the time period assigned for decoding processing (1000 μs). Therefore decoding processing is discontinued with the entire process unfinished.

In this case, if decoding is performed in order from the data before decoding from User#1 without performing decoding order control, the time taken to perform decoding exceeds the time period assigned for decoding processing (1000 μs) in the course of decoding of the data before decoding from User#8. That is, decoding of the data before decoding from Users #8, #9 and #10 is not completed and the results of decoding of all the data from these users are NG. The results of decoding with respect to Users #1, #5, and #7 for which decoding is performed before decoding for User #8 are "NG" even though decoding is repeated until the number of decoding iterations becomes equal to the maximum number (8) of decoding iterations. Decoding is completed only for the four of the ten users.

On the other hand, if decoding is performed in the order shown in FIG. 6, decoding even for the eighth User #1 is completed. The processing time exceeds 1000 μs in the course of decoding for the ninth User #7, so that decoding for Users #5 and #7 is not completed and the results of decoding of the data before decoding from these users are NG. Decoding for all of the users except User#1 for whom decoding is performed before decoding for User #7 is completed. Decoding is completed for the seven of the ten users.

Thus, in the present exemplary embodiment, decoding device 100 estimates decoding completion times with respect to users, and performs decoding of data before decoding from the users in increasing order of the estimated decoding completion time.

Decoding of data before decoding from a larger number of users is completed within a certain time period by decoding of the data before decoding from the users in increasing order of the decoding completion time, thus limiting a reduction in throughput.

Second Exemplary Embodiment

Figure 7:
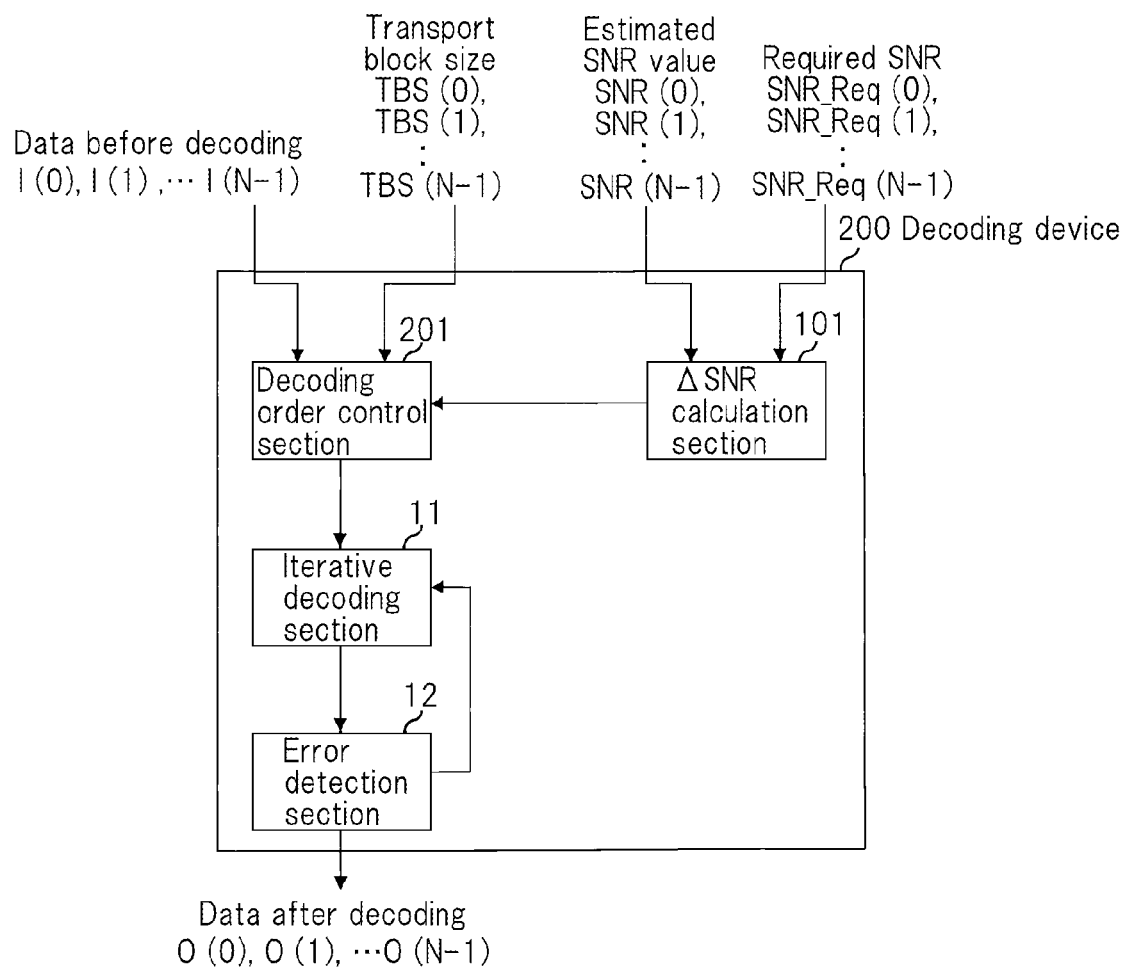
FIG. 7 is a block diagram showing the configuration of a decoding device in a second exemplary embodiment of the present invention.

FIG. 7 is a block diagram showing the configuration of decoding device 200 in a second exemplary embodiment of the present invention.

In FIG. 7, components corresponding to those shown in FIG. 3 are indicated by the same reference numerals. The description for the corresponding components will not be repeated.

Decoding device 200 shown in FIG. 7 differs from decoding device 100 in the first exemplary embodiment in that decoding order control section 102 is replaced with decoding order control section 201.

Decoding order control section 201 is provided with ΔSNRs calculated by ΔSNR calculation section 101 with respect to a plurality of users, data before decoding I(0), I(1), . . . , I(N−1) from the users, and transport block sizes (TBSs) (TBS(0), TBS(1), . . . , TBS(N−1)) which indicate the sizes of the data before decoding Suffixes in brackets for the TBSs represent user numbers.

Decoding order control section 201 estimates a decoding completion time with respect to each user based on ΔSNR calculated with respect to the user and the TBS of the data before decoding from the user. Decoding order control section 201 assigns priorities to the users in increasing order of the estimated decoding completion time, and outputs to iterative decoding section 11 the data before decoding from the users in descending order of the assigned priorities. A method of assigning priorities to the users will be described later.

The operation of decoding order control section 201 will next be described.

Figure 8:
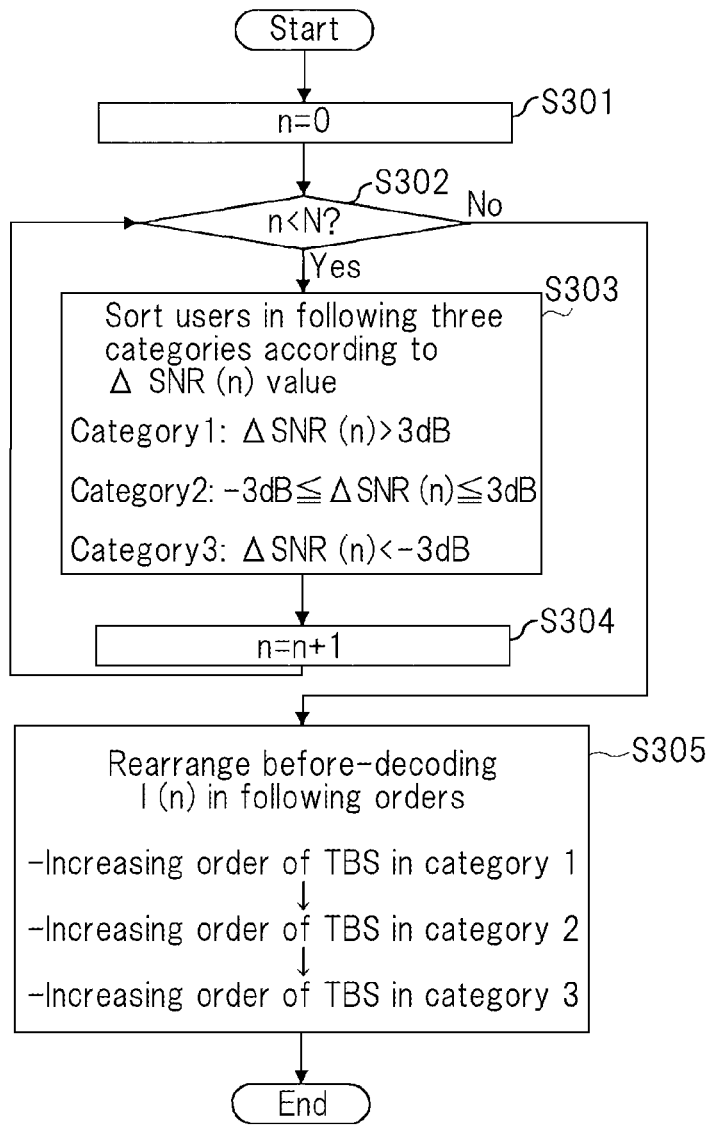
FIG. 8 is a flowchart showing the operation of a decoding order control section shown in FIG. 7.

FIG. 8 is a flowchart showing the operation of decoding order control section 201.

Decoding order control section 201 starts processing in order from n=0 (step S301).

Decoding order control section 201 first determines whether or not n is smaller than N (step S302).

If n is smaller than N (step S302: Yes), decoding order control section 201 sorts the user assigned user number n into one of categories 1 to 3 based on ΔSNR(n) calculated with respect to the user (step S303). In this sorting, decoding order control section 201 sorts the user assigned user number n into category 1 if ΔSNR(n) is larger than 3 dB, into category 2 if ΔSNR(n) is not smaller than −3 dB and not larger than 3 dB, or into category 3 if ΔSNR(n) is smaller than −3 dB.

The intervals of ΔSNR corresponding to the categories are not limited to the above-described example. Also, the number of categories is not limited to 3. Two categories or four or more categories may alternatively be defined.

It is desirable to select a certain number of categories and ΔSNR intervals associated with the categories such that ΔSNRs calculated with respect to the users in one of the categories do not vary largely, and that decoding completion times estimated with respect to these users are substantially equal to each other.

Decoding order control section 201 then increments n by 1 (step S304). Processing from step S302 to step S304 is thereafter repeated until n=N−1, thereby sorting each user into one of the categories.

When sorting all the users each into one of the categories is completed, and when n is not smaller than N (step S302: Yes), decoding order control section 201 estimates a decoding completion time with respect to each user.

If ΔSNR calculated for one of the users is larger, it is estimated that the decoding completion time with respect to the user is shorter, as described above.

Accordingly, decoding order control section 201 estimates, with respect to the users sorted into different ones of the categories, that the decoding completion time with respect to one of the users is shorter if the category into which the user is sorted is associated with a larger ΔSNR. That is, decoding order control section 201 estimates that the increasing order of the decoding completion times corresponds to the order of the user sorted into category 1, the user sorted into category 2 and the user sorted into category 3.

Since the decoding completion times estimated from ΔSNRs calculated with respect to the users in one of the categories are substantially equal to each other, the decoding completion times with respect to the users are proportional to the TBSs of the data before decoding from the users.

Decoding order control section 201 therefore estimates, with respect to the users sorted into one of the categories, that the decoding completion time with respect to one of the users is shorter if the TBS of the data before decoding from the user is smaller.

Consequently, decoding order control section 201 estimates that the increasing order of the decoding completion time corresponds to the order of the users sorted into category 1 and placed in increasing order of the TBS of the data before decoding, the users sorted into category 2 and placed in increasing order of the TBS of the data before decoding and the users sorted into category 3 and placed in increasing order of the TBS of the data before decoding.

Decoding order control section 201 assigns priorities to the users in increasing order of the estimated decoding completion time, and rearranges the data before decoding according to the array of the users with the assigned priorities in descending order (step S305).

Thus, in the present exemplary embodiment, decoding completion times are estimated with respect to users based on ΔSNRs calculated with respect to the users and TBSs of data before decoding, so that the accuracy of the estimation is improved and decoding of the data from the users in increasing order of decoding completion time can be performed with improved reliability.

The present invention has been described with respect to the exemplary embodiments thereof. However, the present invention is not limited to the above-described exemplary embodiments. Various modifications or changes that can be understood by those skilled in the art can be made in the configuration and details of the present invention without departing from the scope of the present invention.

This application is based upon and claims the benefit of priority from the prior Japanese Application No. 2010-117240 filed on May 21, 2010; the entire contents of which are incorporated herein by reference.

The invention claimed is:

1. A decoding device that performs decoding of data transmitted from each of a plurality of users, comprises:
   an iterative decoding section that repeats decoding of the data until no error is detected in a result of decoding;
   an error detection section that performs error detection on the result of decoding each time decoding is performed by said iterative decoding section, and that, if an error is detected, outputs to said iterative decoding section a signal indicating that the error has been detected in the result of decoding;
   a decoding order control section that estimates, with respect to each of the plurality of users, a decoding completion time, which is a time period required until no error is detected by said error detection section in the result of decoding of the data transmitted from each of the plurality of users, and that assigns priorities to the users in increasing order of the decoding completion time that is estimated; and
   a calculation section that calculates, with respect to each of the plurality of users a difference between an estimated value and a target value of the SNR of the data transmitted from each of the plurality of users,
   wherein said iterative decoding section performs decoding of the data transmitted from the users for the users in descending order of the priorities assigned by said decoding order control section,
   wherein said decoding order control section estimates, with respect to each of the plurality of users, the decoding completion time with respect to each of the plurality of users based on the result of calculation of the difference in the SNR with respect to each of the plurality of users and a size of the data transmitted from each of the plurality of users,
   wherein said decoding order control section sorts each of the plurality of users into one of a plurality of categories based on the result of calculation of the difference in the SNR with respect to each of the plurality of users,
   said decoding order control section estimates, with respect to the users sorted into different categories, that the decoding completion time with respect to one of the users is shorter if a category into which each of the plurality of users is sorted is associated with a larger difference in the SNR calculated by said calculation section, and said decoding order control section estimates, with respect to the users in one of the categories, that the decoding completion time with respect to one of the users is shorter if the size of the data transmitted from each of the plurality of users is smaller.

2. A decoding order control method applied to a decoding device that performs decoding of data transmitted from each of a plurality of users, comprises:

repeating decoding of the data until no error is detected in a result of decoding;

performing error detection on the result of decoding each time decoding is performed, and outputting, when an error is detected, a signal indicating that the error has been detected in the result of decoding;

estimating, with respect to each of the plurality of users, a decoding completion time as a time period required until no error is detected in the result of decoding of the data transmitted from each of the plurality of users, and assigning priorities to the users in increasing order of the decoding completion time that is estimated; and calculating, with respect to each of the plurality of users, a difference between an estimated value and a target value of the SNR of the data transmitted from each of the plurality of users, wherein decoding of the data transmitted from the users is performed for the users in descending order of the priorities that is assigned, wherein with respect to each of the plurality of users, the decoding completion time with respect to each of the plurality of user is estimated based on the result of calculation of the difference in the SNR with respect to each of the plurality of users and a size of the data transmitted from each of the plurality of users, wherein each of the plurality of users is sorted into one of a plurality of categories based on the result of calculation of the difference in the SNR with respect to each of the plurality of users, it is estimated, with respect to the users sorted into different ones of the categories, that the decoding completion time with respect to one of the users is shorter if a category into which each of the plurality of users is sorted is associated with a larger difference in the SNR that is calculated, and it is estimated, with respect to the users in one of the categories, that the decoding completion time with respect to one of the users is shorter if the size of the data transmitted from each of the plurality of user is smaller.

* * * * *